(12) United States Patent
Yoshihara et al.

(10) Patent No.: US 6,527,860 B1
(45) Date of Patent: Mar. 4, 2003

(54) SUBSTRATE PROCESSING APPARATUS

(75) Inventors: Kousuke Yoshihara, Kumamoto-Ken (JP); Akihiro Fujimoto, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 11 days.

(21) Appl. No.: 09/685,075

(22) Filed: Oct. 10, 2000

(30) Foreign Application Priority Data

Oct. 19, 1999 (JP) ............................................ 11-296792

(51) Int. Cl.[7] .......................... B05C 15/00; B05C 11/02
(52) U.S. Cl. .............................. 118/50; 118/52; 118/62; 118/63; 118/64
(58) Field of Search .............................. 118/52, 58, 64, 118/320, 62, 61, 63, 50; 427/240, 425

(56) References Cited

U.S. PATENT DOCUMENTS 5,695,817 A * 12/1997 Tateyama et al. ........... 427/240
5,762,709 A    6/1998 Sugimoto et al.
5,972,078 A * 10/1999 Collins et al. ................. 95/224
6,284,043 B1 * 9/2001 Takekuma .................... 118/52

FOREIGN PATENT DOCUMENTS

JP             11-070354             3/1999

* cited by examiner

Primary Examiner—Richard Crispino
Assistant Examiner—George R. Koch, III
(74) Attorney, Agent, or Firm—Rader, Fishman & Grauer PLLC

(57) ABSTRACT

A spin chuck for holding a wafer to the front face of which a resist solution is supplied, a cup for housing the spin chuck and forcibly exhausting an atmosphere around the wafer by exhaust from the bottom thereof, and an air flow control plate, provided in the cup to surround the outer periphery of the wafer, for controlling an air flow in the vicinity of the wafer are provided. Accordingly, a state of a special air flow at an outer edge portion of a substrate to be processed can be eliminated, thereby preventing an increase in film thickness at the outer edge portion.

13 Claims, 12 Drawing Sheets

PRIOR ART

SUBSTRATE PROCESSING APPARATUS

BACKGROUND OF THE INVENTION

1. Field of the Invention

The present invention relates to a substrate processing apparatus for applying a processing solution such as a resist solution or the like to the front face of a substrate to be processed such as a semiconductor wafer or the like.

2. Description of the Related Art

In the process of fabricating semiconductor devices (IC chips) and LCDs, a fine pattern is formed on the front face of a substrate to be processed such as a semiconductor or a glass substrate with high precision and high density by means of photolithography.

In the fabrication of semiconductor devices, for example, after a resist solution is applied on the front face of the semiconductor wafer, the semiconductor wafer is exposed in accordance with a predetermined pattern, and then subjected to developing processing and etching processing, whereby a predetermined circuit pattern is formed.

In recent years, the line width of a semiconductor circuit to be formed by photolithography has tended to become finer, and with this tendency, it is stringently required to make a resist film thinner and to make film thickness uniform. Namely, it is desirable to make the thickness of a resist solution film thin and uniform as much as possible since the line width of a circuit to be formed is proportional to the thickness of the resist solution film and the wavelength of exposure.

In a spin-coating method, the thickness of a resist film can be controlled by regulating the rotation speed of the wafer. Therefore, in the case of the wafer 300 mm in diameter, it is possible to make a film thinner by rotating the wafer at a considerably higher speed.

Since the wafer is rotated at a high speed in this spin-coating method, the amount of a resist solution thrown out to the outside of the wafer from the edge portion of the wafer is large. In the spin-coating method, the wafer is rotated in a cup in order to catch the resist solution thrown out.

Moreover, in this case, air is exhausted from the bottom of the cup in order to prevent the resist solution thrown out of the edge portion of the wafer to fly high above the cup in the form of mist and contaminate other apparatus. Thereby, a down flow in a clean room is drawn in from the upper side of the cup, and an air flow from the upper side to the lower side is formed in the cup, thus preventing mist of the resist solution to fly off to the upper side of the cup.

SUMMARY OF THE INVENTION

In the case of a resist coating apparatus in which a wafer is rotated at a high speed as described above, however, a phenomenon in which only a resist film at a peripheral edge portion of the wafer becomes thicker compared with that at the other portions (a phenomenon of an increase in film thickness at the peripheral edge portion) sometimes occurs.

An object of the present invention is to provide a substrate processing apparatus capable of preventing an increase in the thickness of a coating film at an outer edge portion of a substrate to be processed in the process of making the film thinner by spreading a coating film applied on the substrate to be processed by centrifugal force.

According to a first aspect of the present invention, a substrate processing apparatus, comprising: a substrate holding mechanism for holding a substrate to be processed to the front face of which a processing solution is supplied; a container for housing the substrate holding mechanism and forcibly exhausting an atmosphere around the substrate to be processed by exhaust from the bottom thereof; and an air flow control plate, provided in the container to surround the outer periphery of the substrate to be processed, for controlling an air flow in the vicinity of the substrate to be processed, is provided.

According to a second aspect of the present invention, a substrate processing apparatus for processing a substrate having a first face and a second face, comprising: a holding and rotating section for holding and rotating the first face of the substrate; a solution supplying section for supplying a solution to the second face of the substrate; and an air flow control plate, disposed to surround the outer periphery of the substrate being held and rotated, having a third face with almost the same height as the second face, the third face being provided with a through-hole, is provided.

According to a third aspect of the present invention, a substrate processing apparatus for processing a substrate having a first face and a second face, comprising: a holding and rotating section for holding and rotating the first face of the substrate; a solution supplying section for supplying a solution to the second face of the substrate; and a gas-liquid separating plate, disposed to surround the outer periphery of the substrate being held and rotated, allowing a gas flowing outward from the outer periphery of the substrate to pass over the second face and allowing a liquid flowing outward from the outer periphery of the substrate to pass over the first face.

These objects and still other objects and advantages of the present invention will become apparent upon reading the following specification when taken in conjunction with the accompanying drawings.

DETAILED DESCRIPTION OF THE PREFERRED EMBODIMENT

Preferred embodiments of the present invention will be explained below with reference to the drawings.

Figure 1:
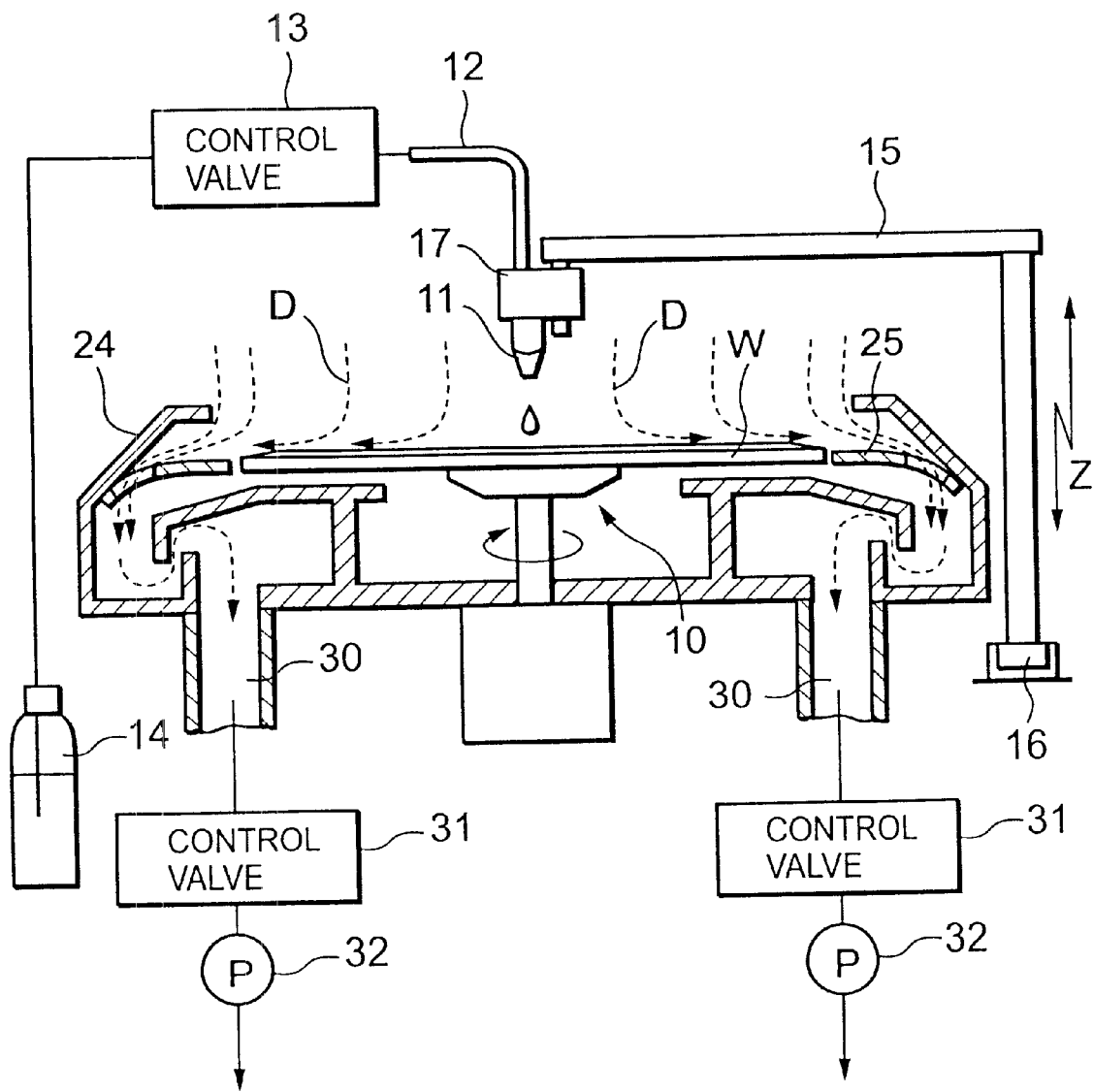
FIG. 1 is a schematic block diagram showing a resist solution coating unit according to an embodiment of the present invention.
Figure 2:
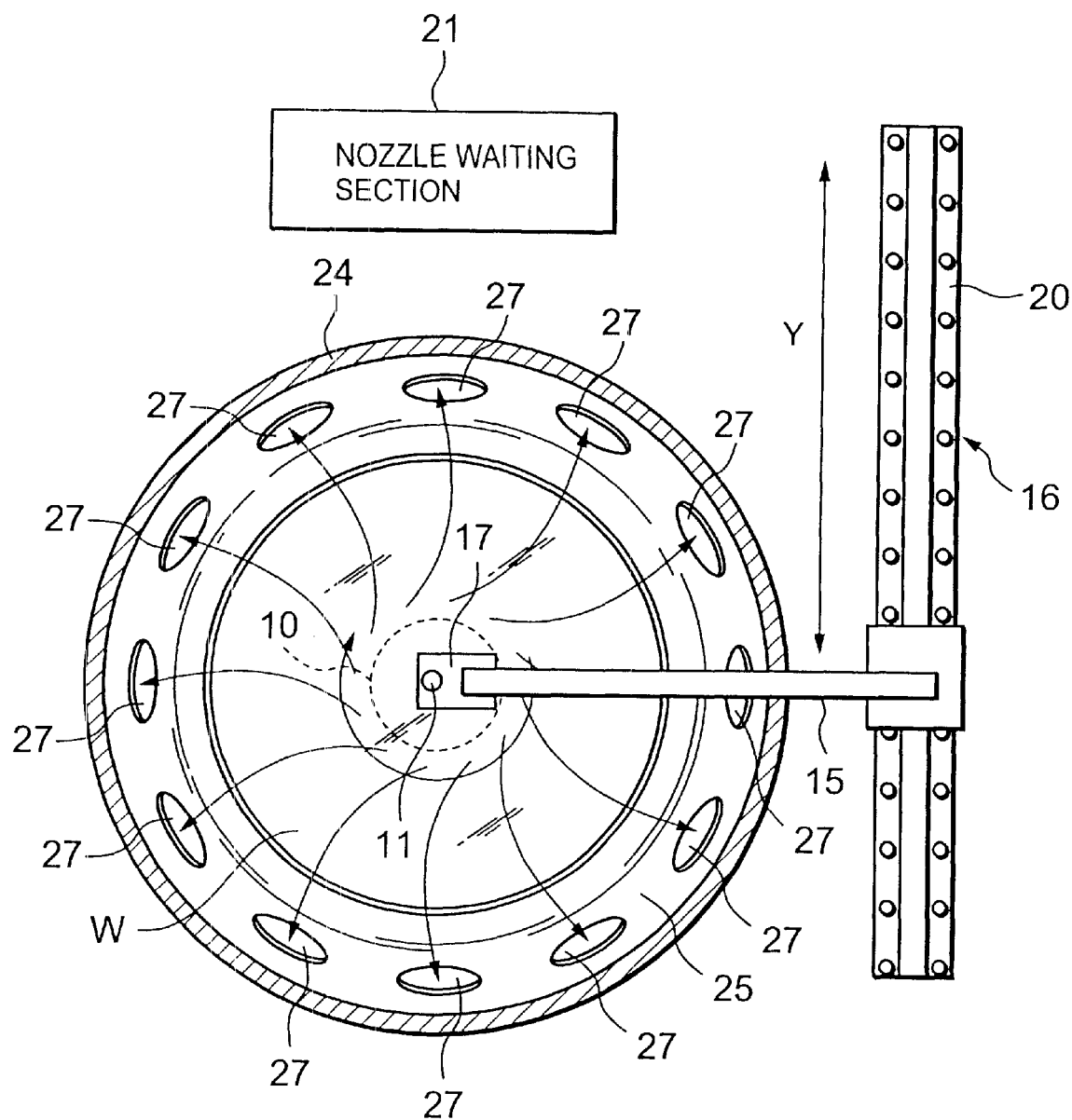
FIG. 2 is a plan view of the resist solution coating unit shown in FIG. 1.

FIG. 1 is a schematic block diagram showing an example in which the present invention is applied to a resist solution coating unit for applying a resist solution on the front face of a semiconductor wafer (hereinafter referred to as "a wafer W"). FIG. 2 is a plan view of this unit seen from above.

As shown in FIG. 1, this unit has a spin chuck 10 for suction-holding the wafer W on the upper face thereof and rotationally and vertically driving the wafer W. A supply nozzle 11, held to be able to face the wafer W, for dropping a resist solution onto the wafer W is disposed above the spin chuck 10. The nozzle 11 is connected to a resist solution tank 14 with a control pipe 12 and a control valve 13 between them.

The nozzle 11 is held at a forward end of a Z-drive mechanism 15 formed into an L-shape as illustrated with a holder 17 between them. A base end portion of the Z-drive mechanism 15 is held by a Y-direction moving mechanism 16. As shown in FIG. 2, the Y-direction moving mechanism 16 has Y-rails 20 extending to the outside of a cup 24 along a Y-direction and can move the nozzle 11 between the wafer W and a nozzle waiting section 21. The nozzle waiting section 21 is structured to be able to house the nozzle 11 and to clean a tip portion of the nozzle 11.

The cup 24 for catching an excessive resist solution thrown out while the wafer W is being driven rotationally is provided around the spin chuck 10, and hence the resist solution thrown out is forcibly drained from a drain pipe not illustrated.

As shown in FIG. 1, an air flow control plate 25 being the principal portion of this invention is disposed in a gap between the wafer W held by the spin chuck 10 and an inner peripheral face of the cup 24. A side facing the wafer W of the air flow control plate 25 is positioned at almost the same height as the wafer W, and the air flow control plate 25 is curved downward at a gradually increasing gradient toward an outer peripheral portion. This air flow control plate 25 is held within the cup 24 by fixing the outer peripheral portion thereof to the inner peripheral face of the cup 24.

As shown in FIG. 2, this air flow control plate 25 is formed into a doughnut shape to surround the periphery of the wafer W, and a plurality of exhaust holes 27 are formed at predetermined intervals along a circumferential direction. It should be mentioned that FIG. 2 shows the upper portion of the cup 24 in a sectional view for convenience.

Figure 3:
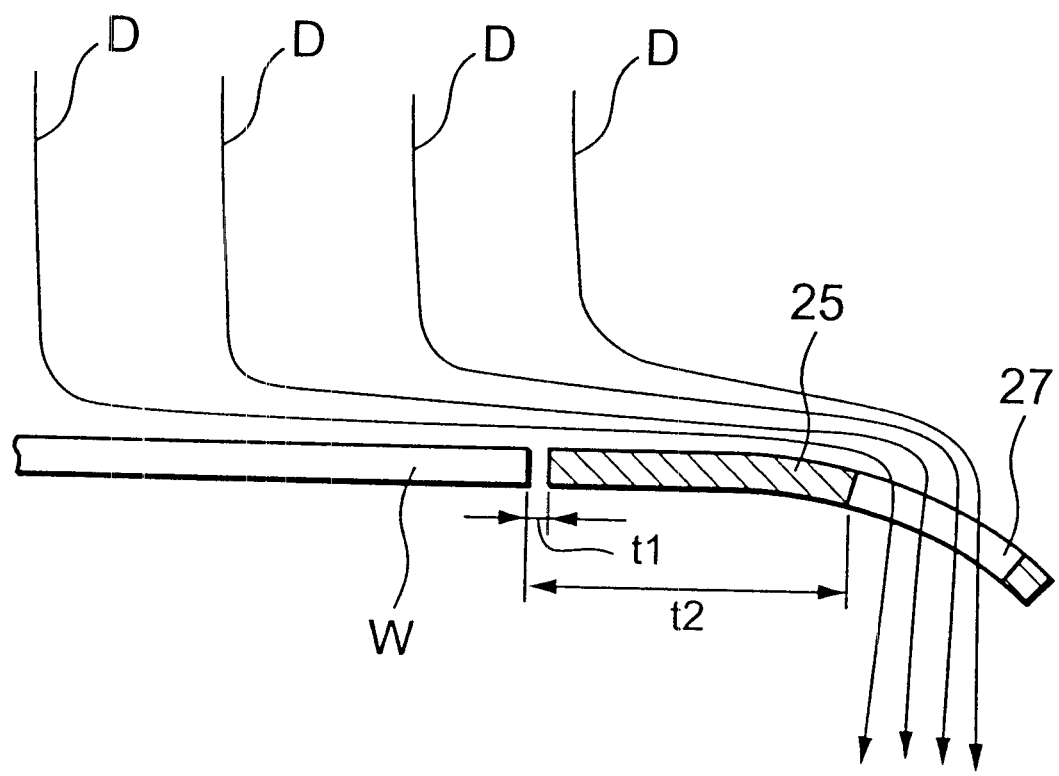
FIG. 3 is an enlarged vertical sectional view showing an outer edge portion of a wafer W and an air flow control plate according to the embodiment.

FIG. 3 is an enlarged vertical sectional view showing the relation between an outer edge portion of the wafer W and the air flow control plate 25. A gap t1 between the air flow control plate 25 and the wafer W is set to be small, for example, 1 mm to 2 mm so that an air flow is not disturbed.

A distance t2 between the outer edge portion of the wafer W and each of the exhaust holes 27 is set to be larger than the gap t1, for example, 10 mm or more so that an air flow at the outer edge portion of the wafer does not have a special shape compared with the other portions of the front face. Thus, an air flow passing along the front face of the wafer W continuously passes over the front face of the air flow control plate 25 and goes downward from the exhaust ports 27 provided at positions away from the outer edge portion of the wafer W.

As shown in FIG. 1, an exhaust pipe 30 for exhausting an atmosphere inside the cup is provided at the bottom of the cup 24. The exhaust pipe 30 is connected to a pump 32 with a control valve 31 between them, and forced exhaust is performed by actuating the pump 32. Thus, the interior of the cup 24 has negative pressure, whereby a down flow D inside a clean room is drawn into the cup 24 from above the cup 24. This down flow D is introduced into the bottom of the cup 24 through the exhaust holes 27 of the air flow control plate 25 and let out through the exhaust pipe 30 as described above.

The aforesaid structure enables the state of a special air flow occurring at the outer edge portion of the wafer W to be eliminated. Namely, an inventor, et al. thought that the occurrence of the special air flow at the outer edge portion of a substrate to be processed was one of the causes of an increase in film thickness at the outer edge portion of the substrate to be processed.

Figure 8:
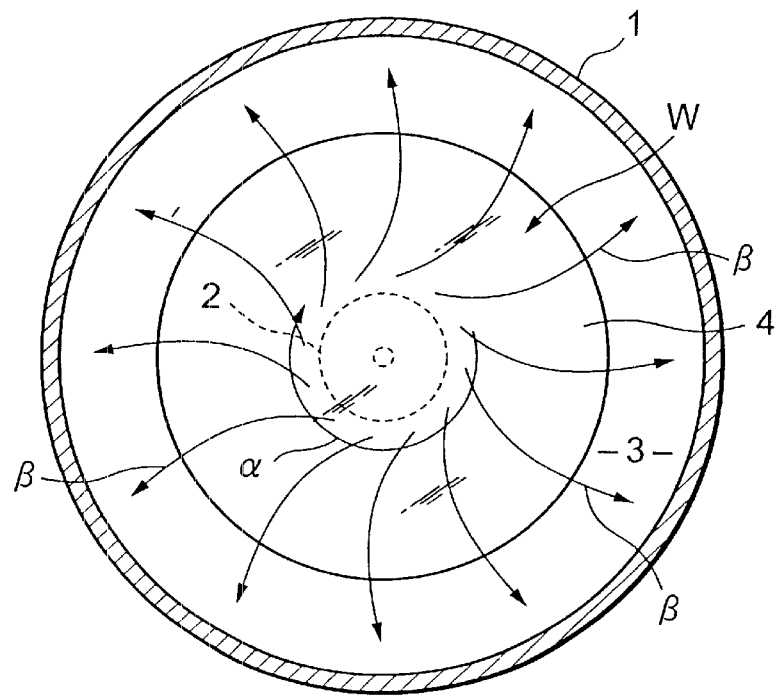
FIG. 8 is a plan view showing a conventional resist solution coating unit.

FIG. 8 is a plan view of a conventional unit showing the wafer W rotating inside a cup 1 and the state of an air flow in the vicinity of the wafer W. When the wafer W is held on a spin chuck 2 and rotated in a direction shown by the arrow α, a down flow introduced from above the cup 1 (this side of the paper surface) is changed into an air flow in a direction β almost parallel to the paper surface by colliding with the upper face of the wafer W, spread spirally by rotational centrifugal force accompanying the rotation of the wafer W, guided to an outer edge portion 4 of the wafer W, and then guided to the bottom of the cup 1 through a gap 3 between the outer edge portion 4 of the wafer W and an inner peripheral face of the cup 1.

Figure 9:
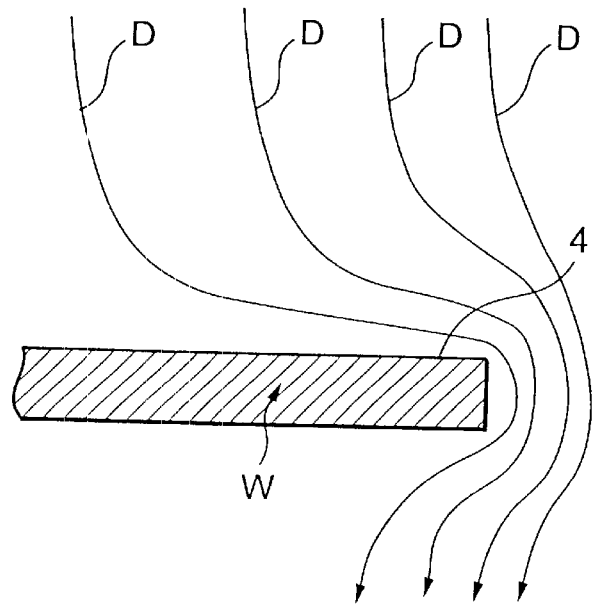
FIG. 9 is a schematic view showing a state of an air flow at an outer edge portion of a wafer in the conventional resist solution coating unit.

FIG. 9 is an enlarged vertical sectional view showing the state of the air flow in the vicinity of the outer edge portion 4 of the wafer W in FIG. 8. When the air flow described above occurs, all down flows supplied to the entire area of the front face of the wafer W are joined and narrowed at the outer edge portion 4 of the wafer W and pass the outer edge portion 4. As can be seen from FIG. 8, the air flow at the outer edge portion 4 of the wafer W is a special flow different from that at the other portions of the front face of the wafer W.

The inventor, et al. thought that the state of this special air flow at the outer edge portion 4 of the wafer W caused an increase in film thickness at the outer edge portion, and came to think that the uniformity of film thickness can be obtained by eliminating this special air flow, and thus the unit is structured as above.

Figure 4:
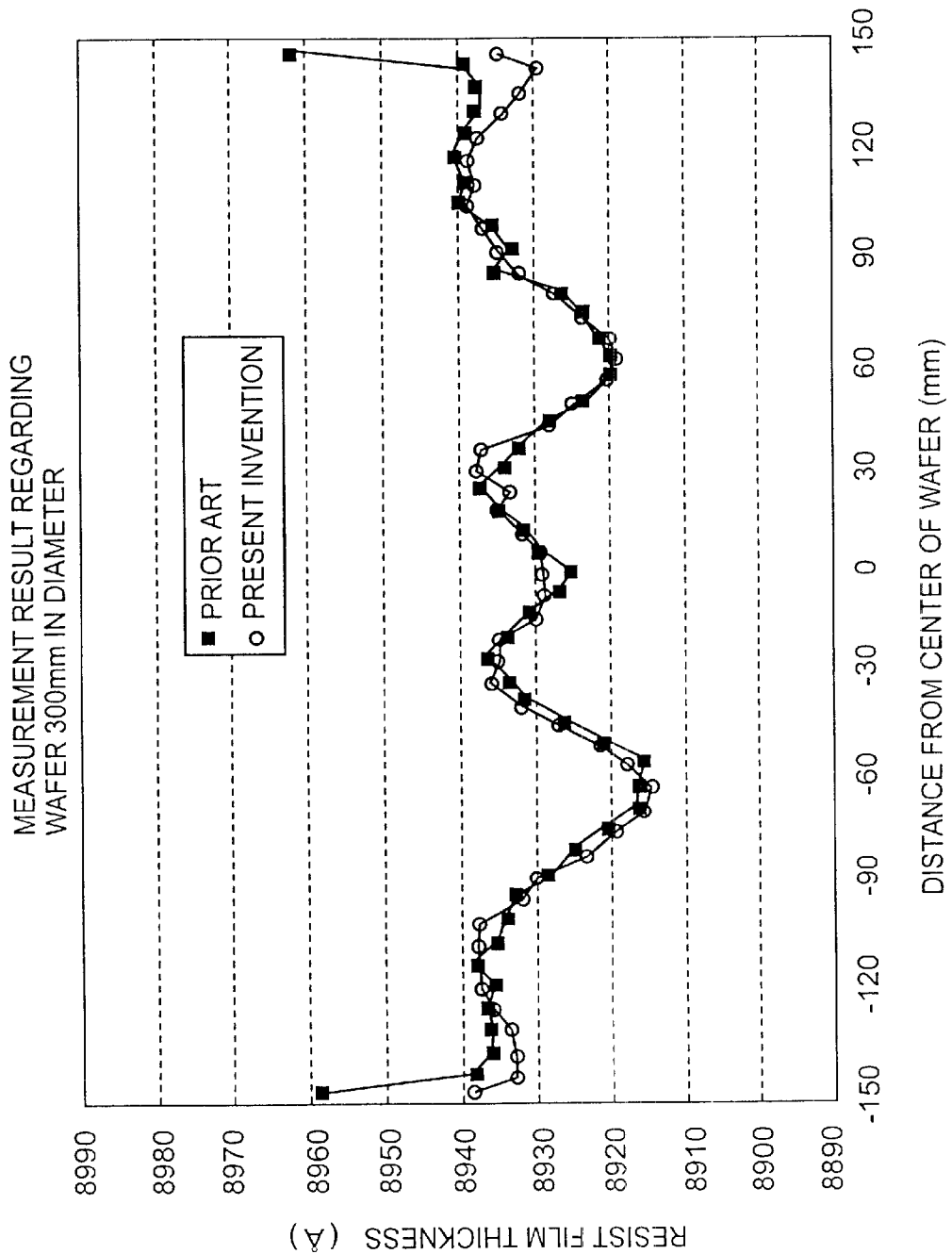
FIG. 4 is a chart showing a verification result of an increase in film thickness at the outer edge portion regarding a wafer 300 mm in diameter according to the embodiment.

FIG. 4 is a chart showing a measurement result of a film thickness distribution when the resist solution is applied on the wafer W with a diameter of 300 mm by this structure. Compared with a film thickness distribution by prior structure drawn in the same chart, it can be seen that an increase in film thickness at the outer edge portion of the wafer W (both end portions in the chart) can be reduced from the conventional 20 angstroms to 5 angstroms.

Accordingly, this has the effect of obtaining a processing unit capable of fully meeting the demand for microminiaturization and high definition of a semiconductor circuit in recent years.

Figure 5:
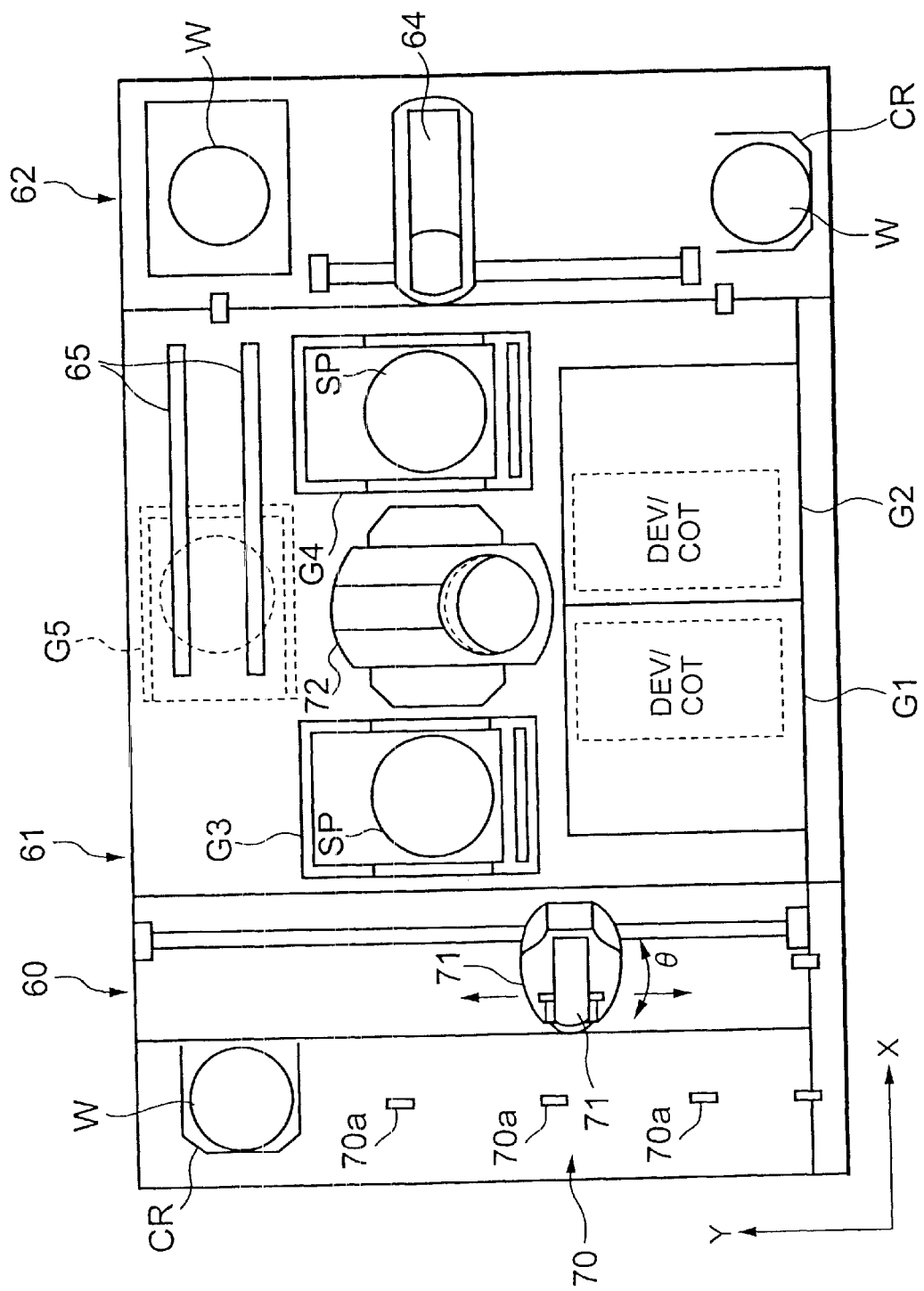
FIG. 5 is a plan view of a coating and developing processing system to which the resist solution coating unit according to the present invention is applied.
Figure 6:
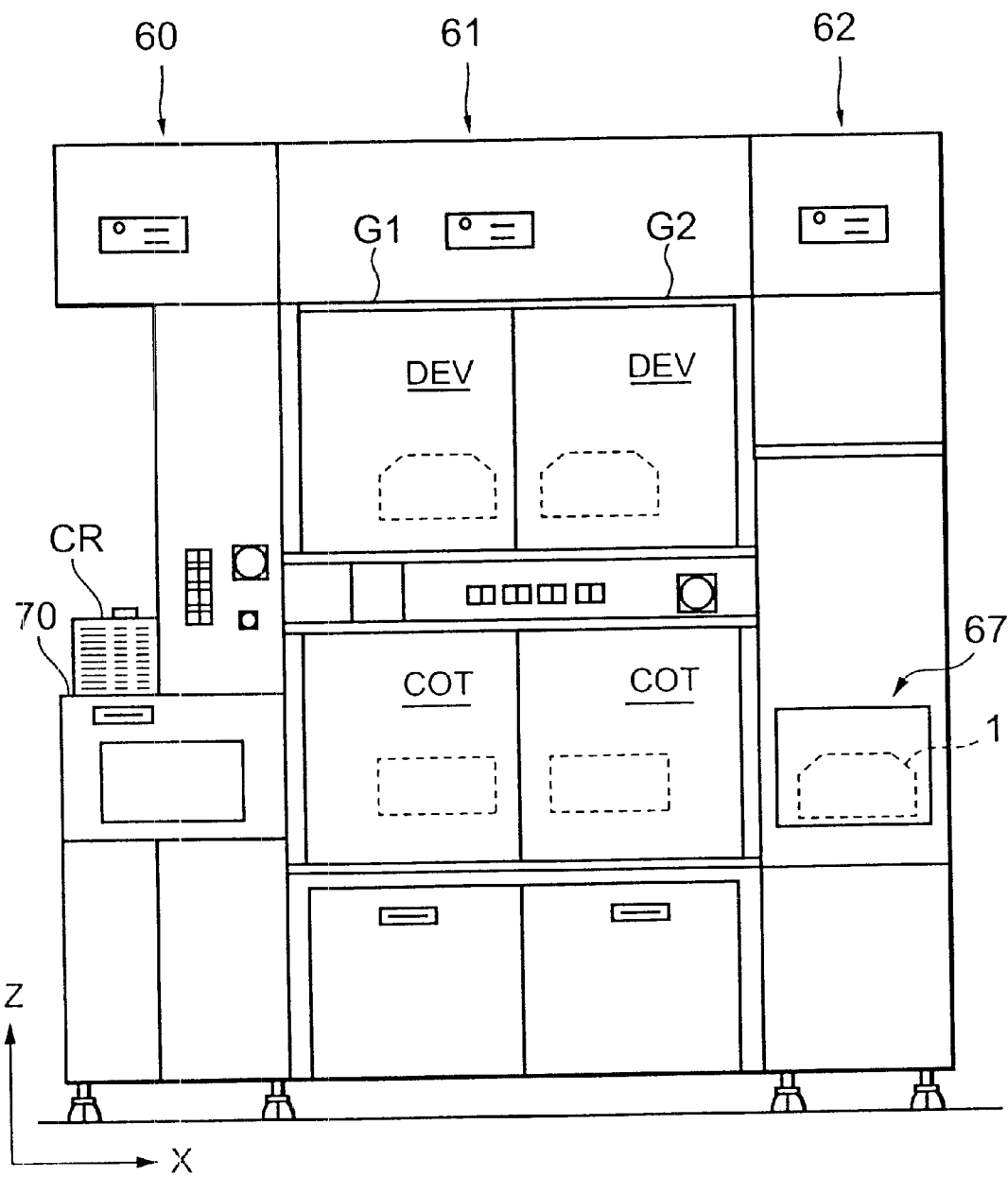
FIG. 6 is a side view of the coating and developing processing system shown in FIG. 5.
Figure 7:
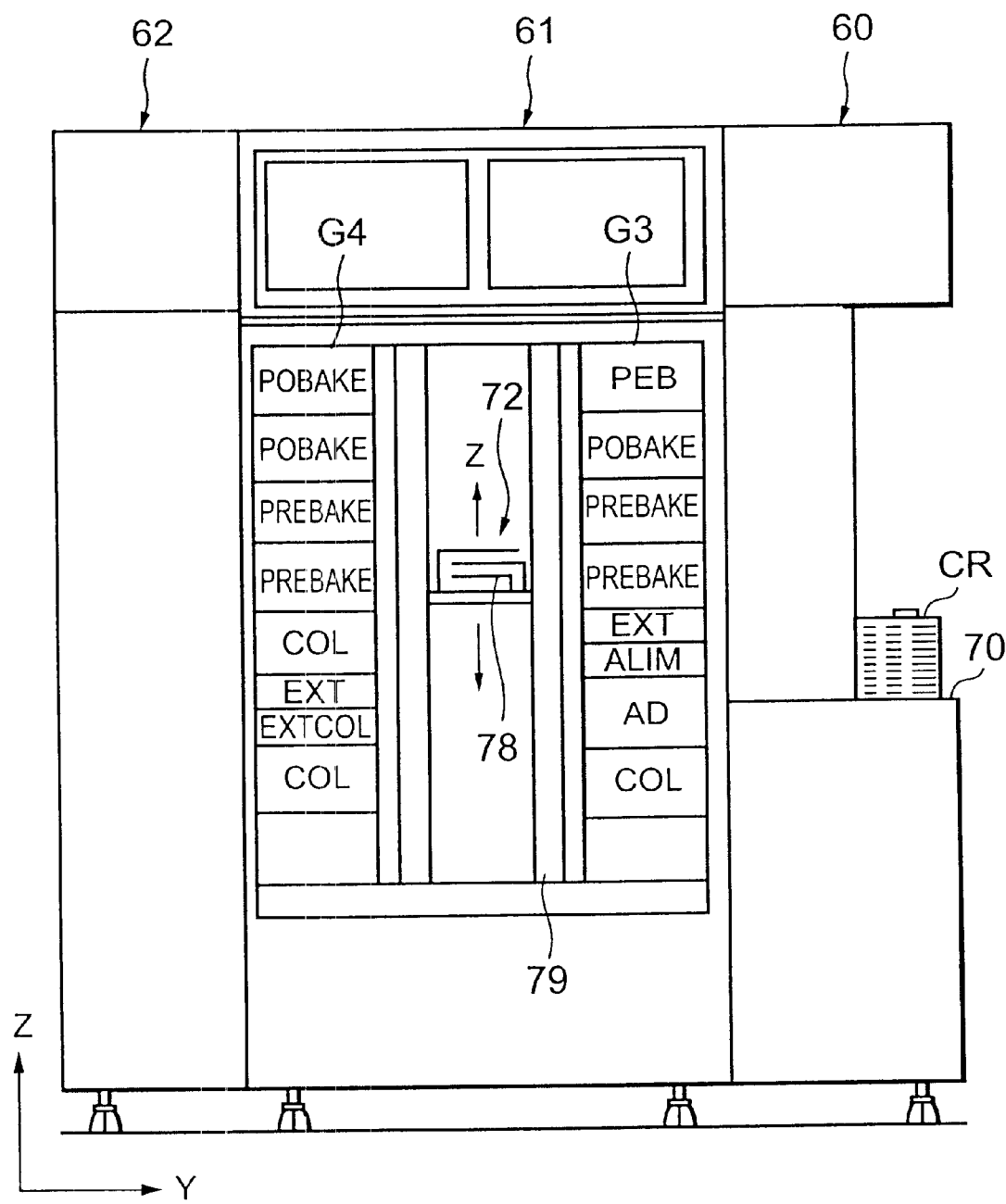
FIG. 7 is a front view for explaining functions in the coating and developing processing system shown in FIG. 5.

Incidentally, it is desirable that this processing unit be applied to a coating and developing processing system shown in FIG. 5 to FIG. 7.

As shown in FIG. 5, this coating and developing processing system includes a cassette section 60 for taking the wafers W one by one out of a wafer cassette CR housing the wafers W, a processing section 61 for performing resist solution coating and developing processing for the wafer W taken out by the cassette section 60, and an interface section 62 for transferring the wafer W coated with the resist solution to an aligner not illustrated.

In the cassette station 60, four projecting portions 70a each for positioning and holding the cassette CR, and a first sub-arm mechanism 71 for taking the wafer W out of the cassette held by the projecting portion 70a are provided. After taking the wafer W out, the sub-arm mechanism 71 rotates in a θ-direction and changes its direction, thereby making it possible to deliver the wafer W to a main arm mechanism 72 provided in the processing section 61.

The wafer W is delivered from/to the cassette 60 to/from the process processing section 61 via a third processing unit group G3. As shown in FIG. 7, the third processing unit group G3 is structured by piling a plurality of processing units vertically. In other words, the processing unit group G3 is structured by piling a cooling unit (COL) for performing cooling processing for the wafer W, an adhesion unit (AD) for performing hydrophobic processing for enhancing the adhesion of the resist solution to the wafer W, an alignment unit (ALIM) for aligning the wafer W, an extension unit (EXT) for making the wafer W wait, two pre-baking units (PREBAKE) for drying a thinner solvent after resist coating, a post-baking unit (POBAKE) and a post-exposure baking unit (PEB) for performing heat processing after exposure processing from the bottom to the top in order.

The aforesaid delivery of the wafer W to the main arm mechanism 72 is performed via the extension unit (EXT) and the alignment unit (ALIM).

As shown in FIG. 5, around the main arm mechanism 72, a first to fifth processing unit groups G1 to G5 including the third processing unit G3 are provided to surround the main arm mechanism 72. Similarly to the aforesaid third processing unit group G3, the other processing unit groups G1, G2, G4, and G5 are also structured by piling various kinds of processing units vertically.

In each of the aforesaid first and second processing unit groups G1 and G2, a developing processing unit (DEV) and a resist solution coating unit (COT) of this embodiment are provided. As shown in FIG. 6, each of the first and second processing unit groups G1 and G2 is structured by piling the resist coating unit (COT) and the developing processing unit (DEV) vertically.

Meanwhile, as shown in FIG. 7, the main arm mechanism 72 includes a cylindrical guide 79 extending vertically and a main arm 78 moved vertically along a guide 79. This main arm 78 is also structured to rotate in a plane direction and move back and forth. Therefore, the vertical movement of the main arm 78 allows the wafer W to optionally get access to each of the aforesaid processing unit groups G1 to G5.

The main arm mechanism 72 which has received the wafer W from the cassette section 60 via the extension unit (EXT) of the third processing unit group G3 first carries the wafer W into the adhesion unit (AD) of the third processing unit group G3, where hydrophobic processing is performed. Then, the wafer W is carried out of the adhesion unit (AD) and subjected to cooling processing in the cooling unit (COL).

The wafer W subjected to the cooling processing is positioned to face the resist solution coating unit (COT) of the first processing unit group G1 (or the second processing unit group G2) and carried thereinto by the main arm mechanism 72. The wafer W coated with the resist solution by the resist solution coating unit (COT) is unloaded by the main arm mechanism 72 and transferred to the interface section 62 via the fourth processing unit group G4.

As shown in FIG. 7, the fourth processing unit group G4 is structured by piling a cooling unit (COL), an extension and cooling unit (EXT·COL), an extension unit (EXT), a cooling unit (COL), two pre-baking units (PREBAKE), and two post-baking units (POBAKE) from the bottom to the top in order.

The wafer W taken out of the resist solution coating unit (COT) is first put in the pre-baking unit (PREBAKE), where the wafer W is dried while the solvent (thinner) is blown off the resist solution.

Moreover, this post-baking unit may be placed separately from the resist solution coating unit (COT) or may be placed in the resist solution coating unit.

Thereafter, after being cooled in the cooling unit (COL), the wafer W is delivered to a second sub-arm mechanism 64 provided in the interface section 62 via the extension unit (EXT).

The second sub-arm 64 which has received the wafer W houses the received wafer W in a cassette CR sequentially. This interface section delivers the wafer W to the aligner not illustrated while the wafer W is being housed in the cassette CR, and receives the cassette CR in which the wafer W which has undergone exposure processing is housed.

The wafer W which has undergone the exposure processing is delivered to the main arm mechanism 72 via the fourth processing unit group G4 in order reverse to the above. After putting the wafer W subjected to exposure in the post-baking unit (POBAKE) if necessary, the main arm mechanism 74 puts the wafer W in the developing processing unit (DEV) of this embodiment, and the wafer W is subjected to developing processing. The wafer W subjected to the developing processing is transferred to any of the baking units and dried by heating, and then let out to the cassette section 60 via the extension unit (EXT) of the third processing unit group G3.

Incidentally, the fifth processing unit group G5 is selectively provided, and structured in the same manner as the aforesaid fourth processing unit group G4 in this example. Further, the fifth processing unit group G5 is held to be movable by rails 65, whereby maintenance processing for the main arm mechanism 72 and the first to fourth processing unit groups G1 to G4 can be easily performed.

When the resist solution coating unit of this invention is applied to the coating and developing processing system shown in FIG. 5 to FIG. 7, coating and developing processing steps of the wafer W can be performed very efficiently since parallel processing for a plurality of wafers can be easily performed. Furthermore, respective processing units are piled vertically, which remarkably reduces the installation area of the system.

Next, another embodiment of the present invention will be explained.

Figure 10:
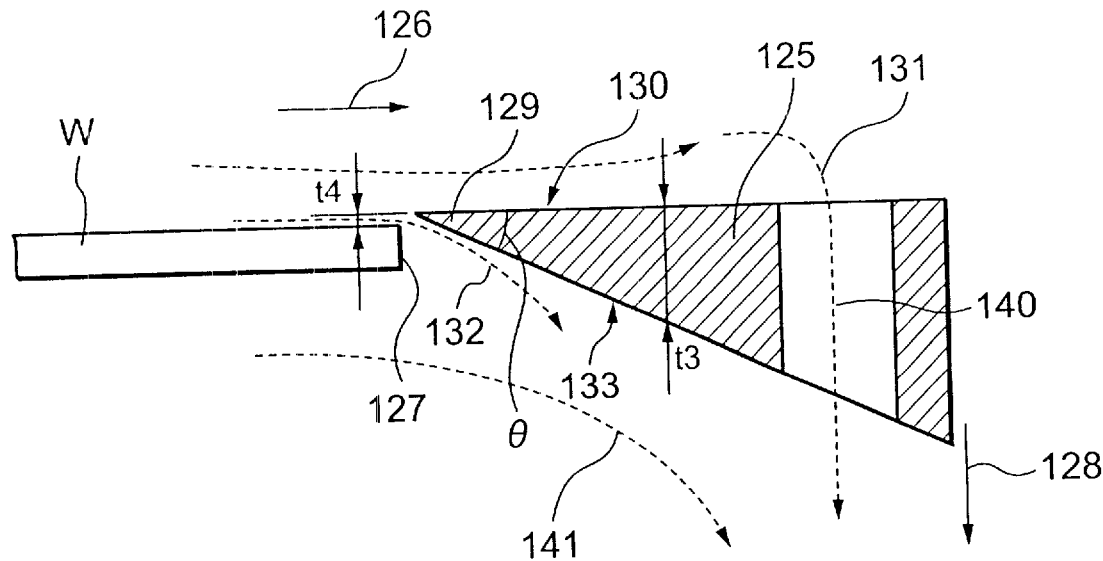
FIG. 10 is an enlarged sectional view of a resist solution coating unit according to another embodiment of the present invention.

In this embodiment, an air flow control plate 125 is structured as shown in FIG. 10.

The sectional shape of the air flow control plate 125 in an outer peripheral direction 126 of the wafer W is formed so that a thickness t3 increases in a downward direction 128 the further away it gets from an outer periphery 127 of the wafer W. For example, the sectional shape of the air flow control plate 125 is triangular, and an interior angle θ of a vertex 129 near the wafer W of the triangular air flow control plate 125 is about 18° to about 35°, and more preferably 20°.

A front face 130 of the air flow control plate 125 and the front face of the wafer W are positioned at almost the same height, but it is desirable that the front face 130 of the air flow control plate 125 be positioned slightly higher than the front face of the wafer W by t4, for example, about 0.5 mm to about 1.0 mm. As a result, a predetermined gap is provided between the outer periphery 127 of the wafer W and the air flow control plate 125. Moreover, a gas 131 flowing outward from the outer periphery 127 of the wafer W can be allowed to pass over the front face 130 of the air flow control plate 125, and a liquid 132 flowing outward from the outer periphery 127 of the wafer W can be allowed to pass over a rear face 133 of the air flow control plate 125. Namely, the air flow control plate 125 according to the present invention can function as a gas-liquid separating plate.

Figure 11:
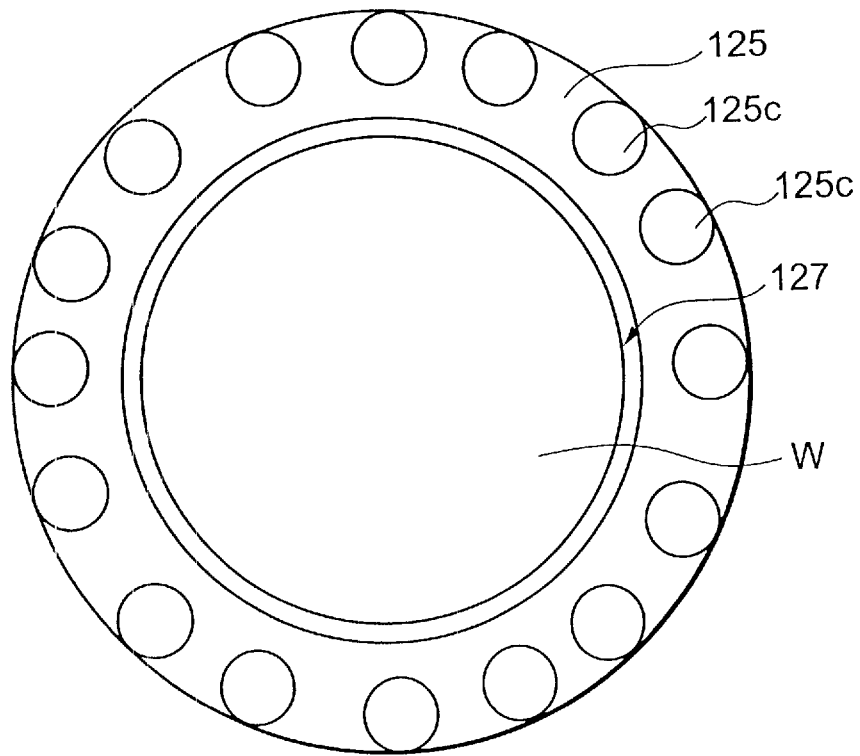
FIG. 11 is a plan view of the resist solution coating unit shown in FIG. 10.
Figure 12:
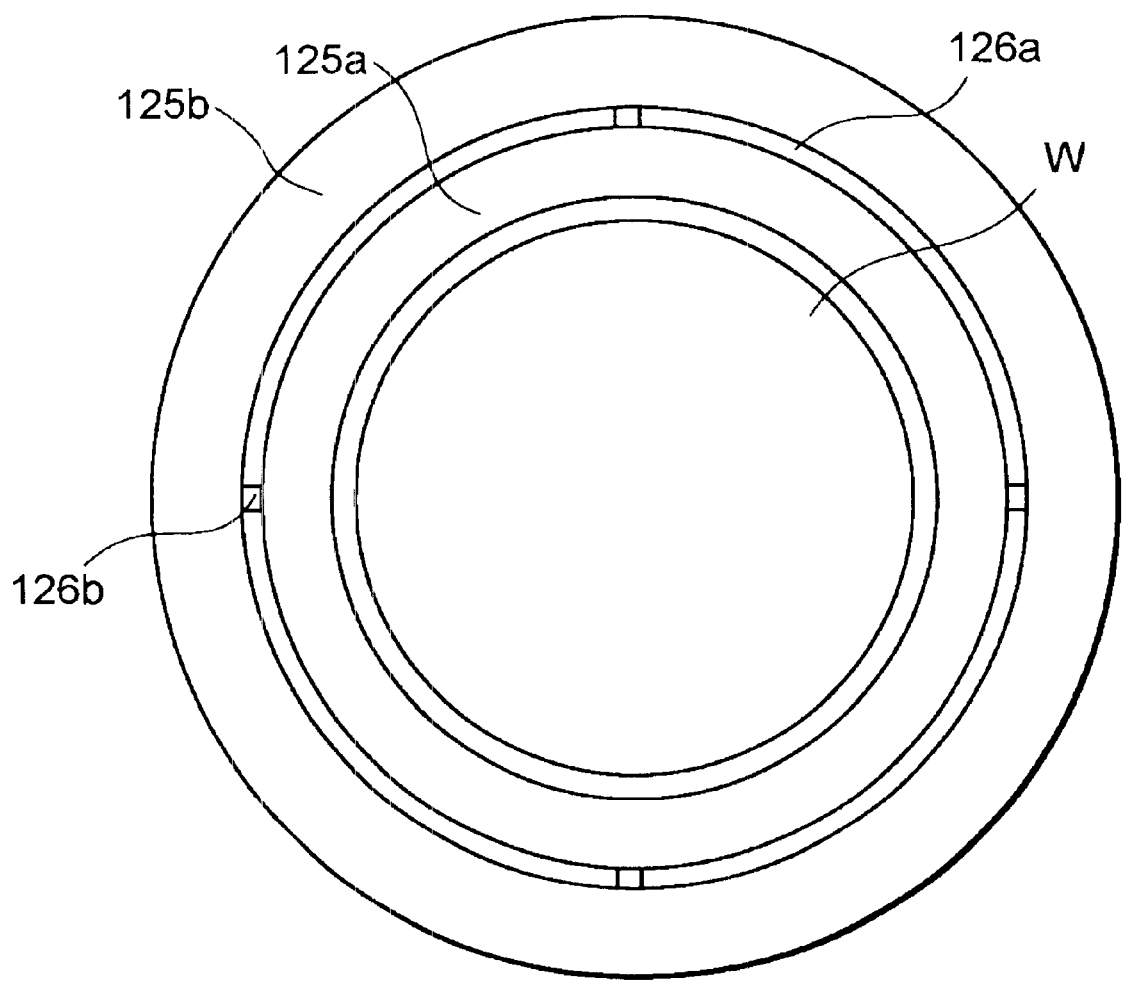
FIG. 12 is a plan view showing a modified example of the resist solution coating unit shown in FIG. 10 and FIG. 11.

As shown in FIG. 11, a plurality of through-holes 125c of this air flow control plate 125 are positioned at predetermined intervals at a predetermined distance from the outer periphery 127 of the wafer W, and each penetrate to the rear face 133 (the lower portion) of the air flow control plate 125. Incidentally, as shown in FIG. 12, a through-hole 126a may be an annular slit provided at a predetermined distance from the outer periphery 127 of the wafer W. The numeral and symbol 126b in FIG. 12 is a communicating member for making air flow control plates 125a and 125b divided into two sections, an inner and outer sections, by the slit-shaped through-hole 126a communicate with each other.

In this embodiment, particularly, an air flow 140 passing through the through-holes 125c of the air flow control plate 125 draws an air flow 141 passing on the rear face 133 side thereinto, the air flow 141 comes to flow downward, and air is exhausted from the exhaust pipe 30 (See FIG. 1). Thus, mist flying about in a space on the rear face 133 side of the air flow control plate 125 can be removed effectively.

Figure 13:
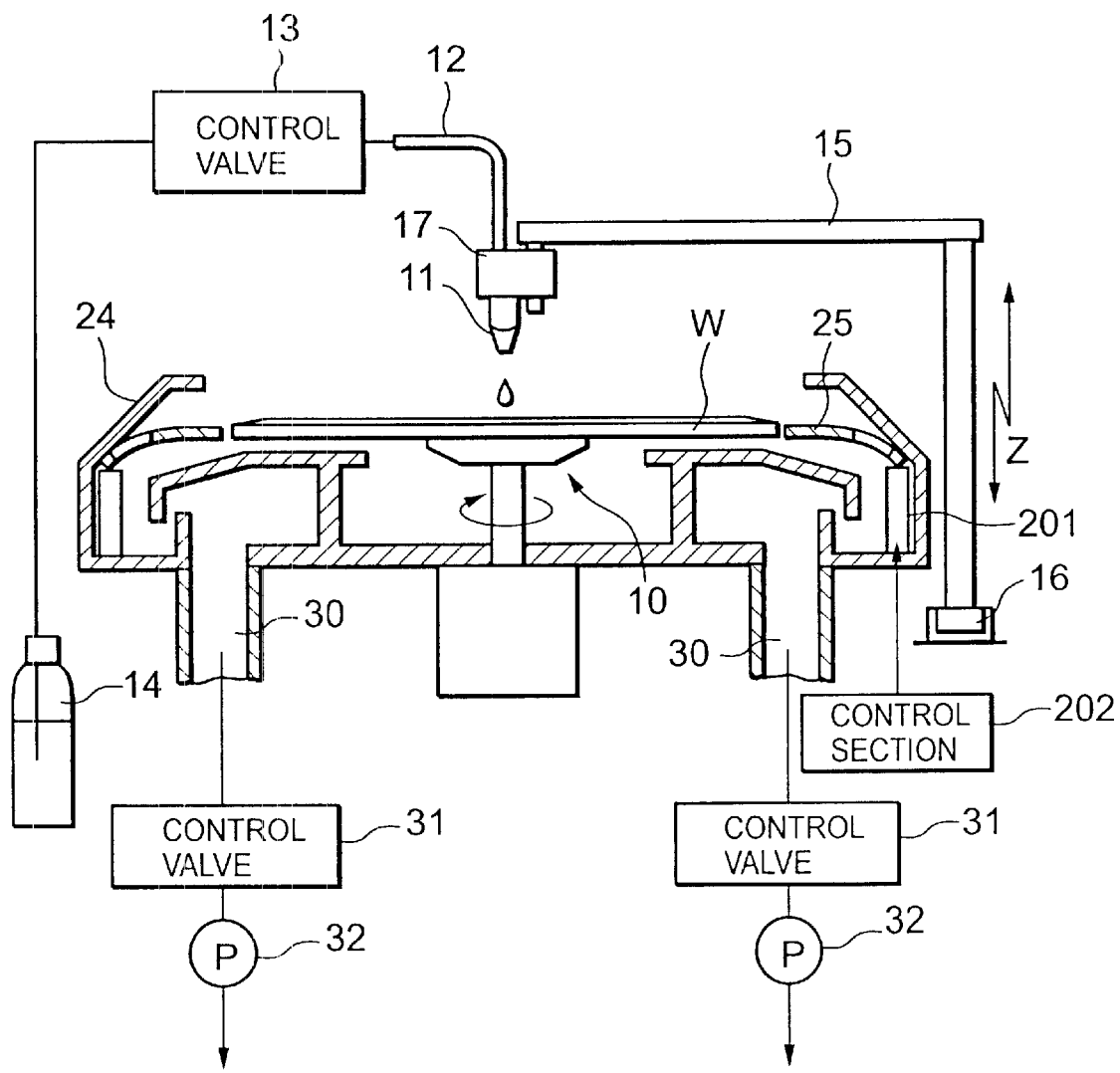
FIG. 13 is a side view of a resist solution coating unit according to still another embodiment of the present invention.
Figure 14:
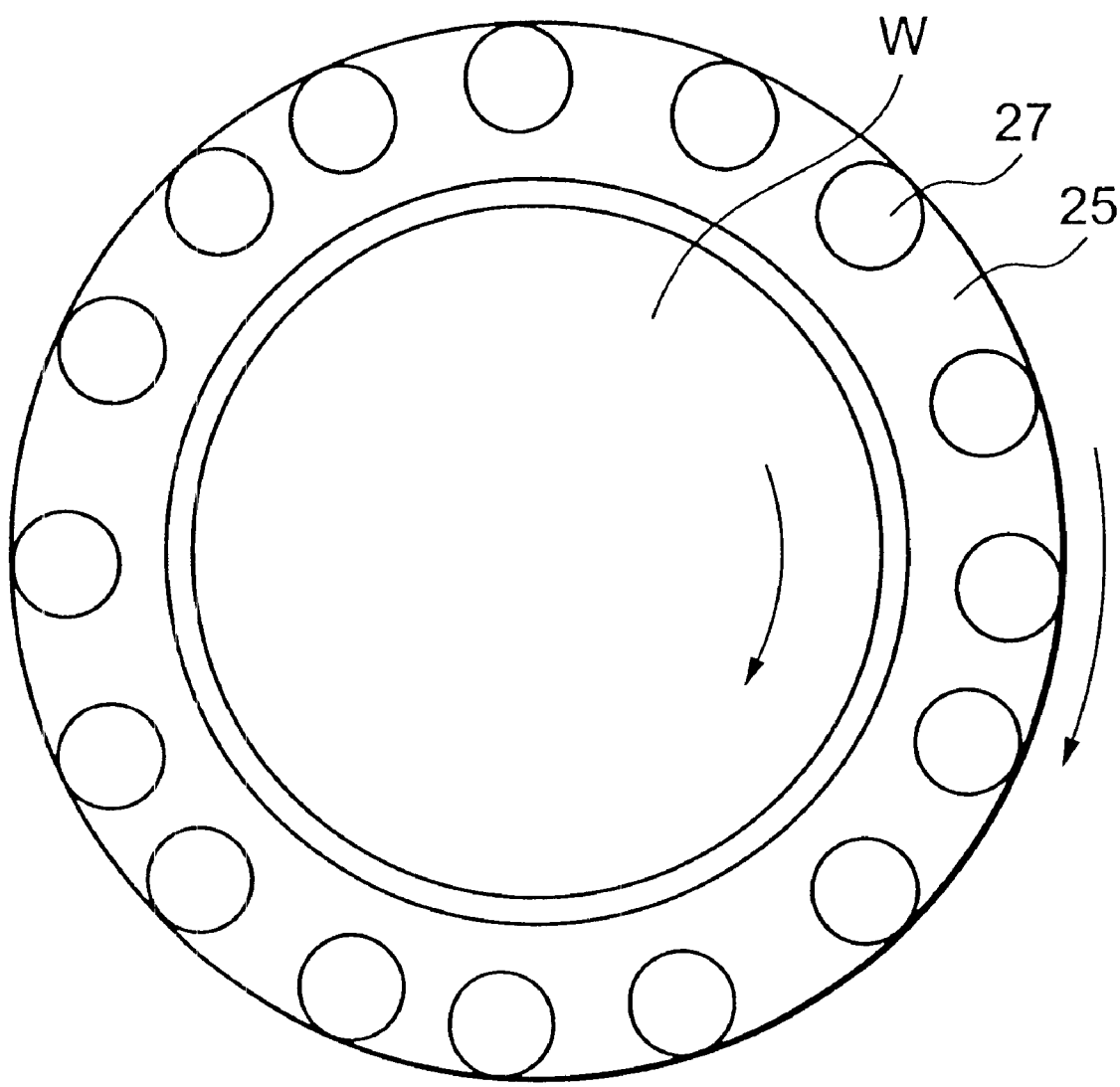
FIG. 14 is an explanatory view of the resist solution coating unit shown in FIG. 13.

As still another embodiment of the present invention, a rotational driving section 201 for rotationally driving the air flow control plate 25 is provided as shown in FIG. 13, and the rotational driving section 210 rotates the air flow control plate in synchronization with the rotation of the wafer W (in the same direction and at the same speed) under the control of a control section 202 as shown in FIG. 14. Consequently, coating ununiformity at the outer periphery of the wafer W can be further reduced, and the rotation speed of the wafer W at the time of coating of the resist solution can be reduced, whereby the extent of selection of the type of a resist solution (particularly, the viscosity of a resist solution), for example, is widened.

It is natural that these embodiments can be applied to apparatus other than such a coating and developing processing system. Furthermore, the aforesaid embodiments can be modified variously without departing of the spirit of the present invention.

Although the aforesaid embodiments are explained with the resist solution coating unit for coating the semiconductor wafer with the resist solution as the example, the present invention is not limited to the semiconductor wafer, and an apparatus for coating a rectangular glass substrate used for LCD fabrication with the resist solution is also available. Moreover, not limited to the resist solution only, the present invention can be applied also to a substrate processing apparatus for supplying, for example, a developing solution to a substrate, thereby specially decreasing mist effectively.

Furthermore, in the aforesaid embodiments, the substrate is rotated, but an apparatus in which the substrate is not rotated is also suitable.

As explained above, according to the present invention, an increase in the thickness of a coating film occurring at the outer portion of a substrate to be processed can be effectively prevented.

The disclosure of Japanese Patent Application No. 11-296792 filed Oct. 19, 1999 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus for processing a substrate having a first face and a second face, comprising:

a holding and rotating section for holding and rotating the first face of the substrate;

a solution supplying section for supplying a solution to the second face of the substrate; and an air flow control plate, disposed to surround the outer periphery of the substrate being held and rotated, having a third face positioned at the same height as the second face, the third face being provided with a through-hole;

wherein a sectional shape of said air flow control plate in an outer peripheral direction of the substrate being held and rotated is formed so that the thickness thereof increases downward the further away it gets from the outer periphery of the substrate.

2. The apparatus as set forth in claim 1, wherein the third face is situated at a position higher than the second face.

3. The apparatus as set forth in claim 2, wherein the difference in height between the third face and the second face is about 0.5 mm to about 1.0 mm.

4. The apparatus as set forth in claim 1, wherein a predetermined gap is provided between the outer periphery of the substrate being held and rotated and said air flow control plate.

5. The apparatus as set forth in claim 1, wherein the sectional shape is triangular.

6. The apparatus as set forth in claim 5, wherein the interior angle of a vertex near the substrate of said air flow control plate of which the sectional shape is triangular is about 18° to about 35°.

7. The apparatus as set forth in claim 1, wherein the through-holes are a plurality of holes provided at a predetermined distance from the outer periphery of the substrate and at predetermined intervals in said air flow control plate, and each penetrating to the lower portion of said air flow control plate.

8. The apparatus as set forth in claim 1, wherein the through-hole is an annular slit provided at a predetermined distance from the outer periphery of the substrate.

9. The apparatus as set forth in claim 1, further comprising:

a rotational driving section for rotationally driving said air flow control plate.

10. The apparatus as set forth in claim 9,
wherein said rotational driving section rotates said air flow control plate in synchronization with the rotation of the substrate.

11. The apparatus as set forth in claim 1, further comprising:
a container for housing said holding and rotating section and forcibly exhausting an atmosphere around the substrate by exhaust from the bottom thereof.

12. A substrate processing apparatus for processing a substrate having a first face and a second face, comprising:
a holding and rotating section for holding and rotating the first face of the substrate;
a solution supplying section for supplying a solution to the second face of the substrate; and
a gas-liquid separating plate having a front face and a rear face, disposed to surround the outer periphery of the substrate being held and rotated, allowing a gas flowing outward from the outer periphery of the substrate to pass over the front face and allowing a liquid flowing outward from the outer periphery of the substrate to pass over the rear face.

13. The apparatus as set forth in claim 12,
wherein a through-hole for forming an air flow from the second face to the first face is formed through the front and rear faces of the gas-liquid separating plate.

* * * * *